(12) United States Patent
Yang et al.

(10) Patent No.: US 7,303,815 B2
(45) Date of Patent: Dec. 4, 2007

(54) FUNCTIONAL BIMORPH COMPOSITE NANOTAPES AND METHODS OF FABRICATION

(75) Inventors: Peidong Yang, Berkeley, CA (US);
Matthew Law, Berkeley, CA (US);
Rongrui He, El Cerrito, CA (US);
Rong Fan, El Cerrito, CA (US);
Franklin Kim, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 275 days.

(21) Appl. No.: 10/642,043

(22) Filed: Aug. 15, 2003

(65) Prior Publication Data
US 2004/0131537 A1    Jul. 8, 2004

Related U.S. Application Data

(60) Provisional application No. 60/404,256, filed on Aug. 16, 2002.

(51) Int. Cl.
*B32B 15/04* (2006.01)
*G01K 5/68* (2006.01)

(52) U.S. Cl. .................. 428/357; 428/397; 428/401; 428/616; 117/87; 977/755; 977/810; 977/811

(58) Field of Classification Search ................ 428/616, 428/617, 357, 364, 373, 375, 378, 379, 389, 428/392, 397, 401, 689; 117/87, 88; 977/DIG. 1, 977/755, 810, 811
See application file for complete search history.

(56) References Cited

U.S. PATENT DOCUMENTS

| | | | |
|---|---|---|---|
| 3,532,528 A * | 10/1970 | Carleton et al. ............. 106/403 |
| 5,221,341 A * | 6/1993 | Franz et al. ................. 106/449 |
| 6,459,095 B1 | 10/2002 | Heath et al. | |
| 6,905,736 B1 * | 6/2005 | Chow et al. ................. 427/564 |
| 2002/0172820 A1 | 11/2002 | Majumdar et al. | |
| 2003/0067003 A1 * | 4/2003 | Gole et al. ..................... 257/64 |
| 2005/0042375 A1 * | 2/2005 | Minami et al. ......... 427/255.32 |

* cited by examiner

*Primary Examiner*—Michael E. Lavilla
(74) *Attorney, Agent, or Firm*—John P. O'Banion

(57) ABSTRACT

A two-layer nanotape that includes a nanoribbon substrate and an oxide that is epitaxially deposited on a flat surface of the nanoribbon substrate is described. The oxide is deposited on the substrate using a pulsed laser ablation deposition process. The nanoribbons can be made from materials such as $SnO_2$, ZnO, MgO, $Al_2O_3$, Si, GaN, or CdS. Also, the sintered oxide target can be made from materials such as $TiO_2$, transition metal doped $TiO_2$ (e.g., $Co_{0.05}Ti_{0.95}O_2$), $BaTiO_3$, ZnO, transition metal doped ZnO (e.g., $Mn_{0.1}Zn_{0.9}O$ and $Ni_{0.1}Zn_{0.9}O$), $LaMnO_3$, $BaTiO_3$, $PbTiO_3$, $YBa_2Cu_3O_z$, or $SrCu_2O_2$ and other p-type oxides. Additionally, temperature sensitive nanoribbon/metal bilayers and their method of fabrication by thermal evaporation are described. Metals such as Cu, Au, Ti, Al, Pt, Ni and others can be deposited on top of the nanoribbon surface. Such devices bend significantly as a function of temperature and are suitable as, for example, thermally activated nanoscale actuators.

38 Claims, 16 Drawing Sheets

FUNCTIONAL BIMORPH COMPOSITE NANOTAPES AND METHODS OF FABRICATION

CROSS-REFERENCE TO RELATED APPLICATIONS

This application claims priority from U.S. provisional application Ser. No. 60/404,256 filed on Aug. 16, 2002, incorporated herein by reference.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to composite nanostructures, and more particularly to composite nanotapes.

2. Description of Related Art

In recent years, nanowires with different cross-section shapes have attracted significant research interest. This interest is largely due to the technological potential of the nanowires as unique types of nanoscale building blocks for future optoelectronic devices and systems. Major efforts have been expended on the development of methods for nanowire synthesis, assembly, and property elucidation. The bulk of the previous research, however, is limited to simple binary semiconductors, and very little research has been undertaken to investigate complex systems like superlattice nanowires and ternary compounds. A significant bottleneck in the field of nanowires is the lack of a general approach to the synthesis of nanowire building blocks composed of complex functional materials such as ternary and quaternary systems.

The present invention recognizes the present drawbacks and provides a solution to one or more of the problems associated therewith.

BRIEF SUMMARY OF THE INVENTION

The present invention provides a versatile approach to the synthesis of composite nanostructures in which the compositional limitation is minimized and the resultant nanostructures can have multiple functionalities such as luminescence, ferromagnetism, ferroelectric properties, or superconducting properties. In the present invention, tin dioxide nanoribbons are used as substrates for thin-film growth using pulsed laser ablation deposition (PLD). Various oxides, such as $TiO_2$, transition metal doped $TiO_2$, ZnO, etc., can then be deposited on the nanoribbons. Electron microscopy and X-ray diffraction studies show that the oxides grow epitaxially on the side surfaces of the nanoribbons with sharp structural and compositional interfaces to form bi-layer nanotapes.

An aspect of the invention is a method for making a nanotape from a nanoribbon substrate, and preferably making a plurality of nanotapes from a plurality of nanoribbons in a batch process. In one embodiment, a plurality of substrates are placed in a quartz tube. The quartz tube is placed within a horizontal tube furnace and a sintered oxide target is provided near the quartz tube. Thereafter, the sintered oxide target is ablated so that it is deposited on the substrates.

In this embodiment, the substrates are nanoribbons and the sintered oxide target is deposited on a flat side of each nanoribbon. Moreover, the nanoribbons can be made from materials such as $SnO_2$, ZnO, MgO, $Al_2O_3$, Si, GaN, CdS and other materials. Further, in this aspect of the invention, the sintered oxide target can be made from materials such as $TiO_2$, transition metal doped $TiO_2$ (e.g., $CO_{0.05}Ti_{0.95}O_2$), $BaTiO_3$, ZnO, transition metal doped ZnO (e.g., $Mn_{0.1}Zn_{0.9}O$ and $Ni_{0.1}Zn_{0.9}O$), $LaMnO_3$, $BaTiO_3$, $PbTiO_3$, $YBa_2Cu_3O_z$, and $SrCu_2O_2$ and other p-type oxides.

In one embodiment, the sintered oxide target is ablated using a pulsed Nd:YAG laser. The Nd:YAG laser pulses at three to ten hertz (3 Hz to 10 Hz) and emits twenty to fifty milliJoules per pulse (20 mJ/pulse to 50 mJ/pulse). Moreover, the sintered oxide target is ablated in an oxygen atmosphere of one hundred to five hundred milliTorrs (100 mTorr to 500 mTorr). Also, the ablation temperature is between six hundred degrees Celsius and seven hundred degrees Celsius (600° C. and 700° C.).

Another aspect of the present invention is a two-layer nanotape structure. The nanotape includes a nanoribbon substrate and an oxide that is epitaxially deposited on a flat surface of the nanoribbon substrate. In this aspect of the present invention, the oxide is deposited on the substrate using a pulsed laser ablation deposition process.

A still further aspect of the invention relates to nanoribbon/metal bilayers and their method of fabrication. In one embodiment, the bilayers are fabricated using thermal evaporation of a metal layer on top of the nanoribbon surface. Metals such as Cu, Au, Ti, Al, Pt, Ni and others can be used to form the metal layer. The structures are useful in nano-mechanics and, in one embodiment, the structures bend significantly in response to temperature and are suitable for use as a thermally activated nanoscale actuators.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus and methods depicted generally in FIG. 1 through FIG. 28. It will be appreciated that the apparatus may vary as to configuration and as to details of the parts, and that the method may vary as to the specific steps and sequence, without departing from the basic concepts as disclosed herein.

Figure 1:
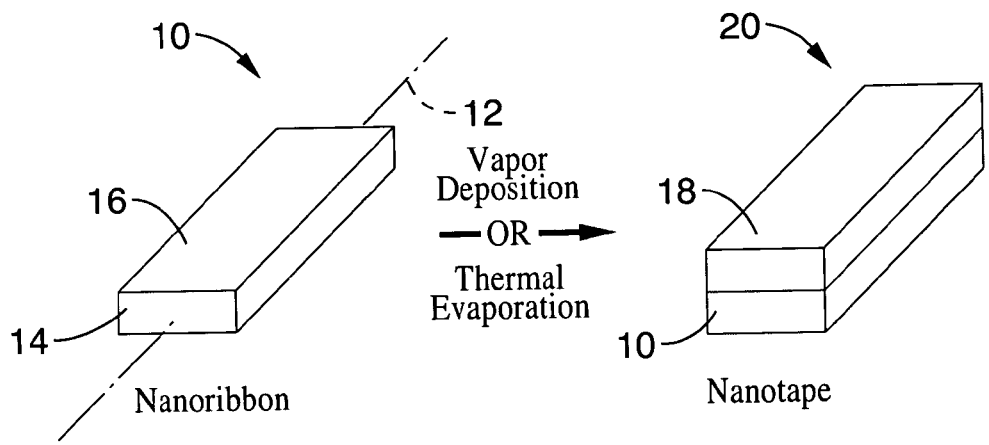
FIG. 1 is a schematic diagram of a nanoribbon and a nanotape according to the present invention.

Referring initially to FIG. 1, a nanoribbon is shown and is generally designated 10. As shown in FIG. 1, the nanoribbon 10 defines a longitudinal axis 12. Moreover, the nanoribbon 10 has a generally rectangular cross-section 14 perpendicular to the longitudinal axis 12. Additionally, the nanoribbon 10 has a relatively wide surface 16 that is parallel to the longitudinal axis 12. By using a vapor deposition or a thermal evaporation process, described in detail below, a layer 18 can be deposited on the wide surface 16 of the nanoribbon 10 to form a nanotape 20 having two layers.

Figure 2:
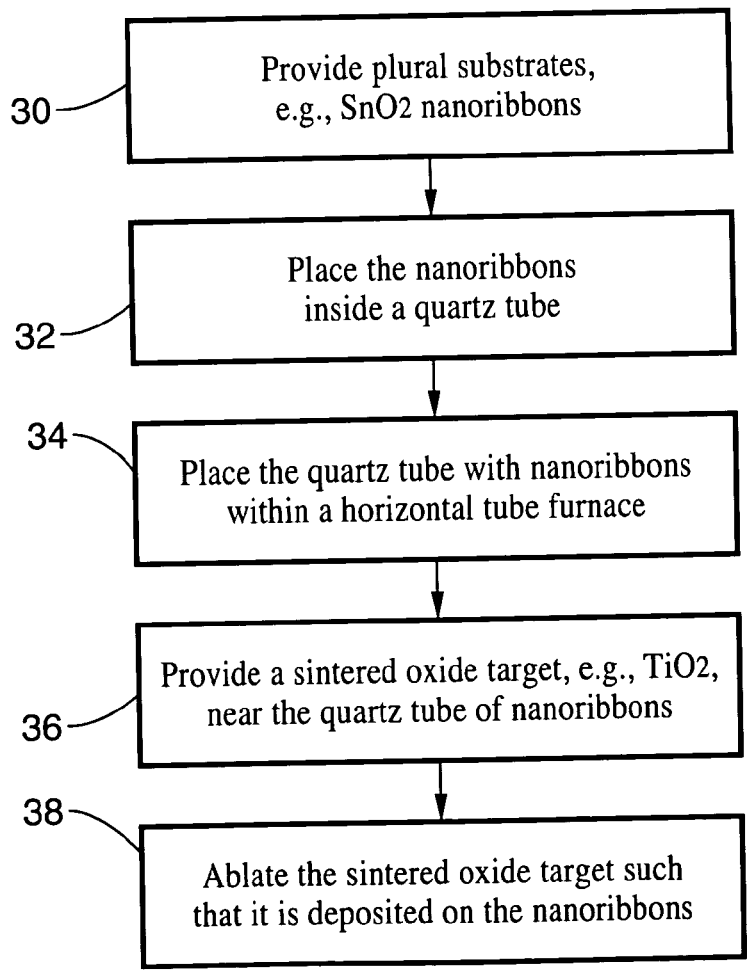
FIG. 2 is a flow chart of a method for making a nanotape according to the present invention.

FIG. 2 shows a method for making nanotapes, e.g., nanotapes have the generally structure of the nanotape 20 shown in FIG. 1. Commencing at block 30, plural substrates are provided. In one exemplary, non-limiting embodiment, the substrates are $SnO_2$ nanoribbons, e.g., nanoribbons having the general structure of the nanoribbon 10 shown in FIG. 1. It can be appreciated that other nanoribbons, e.g., made from materials such as ZnO, MgO, $Al_2O_3$, Si, GaN, CdS and other materials, can be used as substrates. Moving to block 32, the nanoribbons are placed inside a quartz tube. Thereafter, at block 34, the quartz tube with the nanoribbons is placed within a horizontal tube furnace.

Proceeding to block 36, a sintered oxide target is provided near the quartz tube of nanoribbons. It is to be understood that the sintered oxide target can be $TiO_2$, transition metal doped $TiO_2$ (e.g., $CO_{0.05}Ti_{0.95}O_2$), $BaTiO_3$, ZnO, transition metal doped ZnO (e.g., $Mn_{0.1}Zn_{0.9}O$, $Ni_{0.1}Zn_{0.9}O$), $LaMnO_3$, $BaTiO_3$, $PbTiO_3$, $YBa_2Cu_3O_z$, $SrCu_2O_2$ and other p-type oxides, or any other material well known in the art with similar properties. Continuing to block 38, the sintered oxide target is ablated such that it is deposited on the nanoribbons. Preferably, the ablation is a pulsed laser ablation process that can be undertaken using a pulsed Nd:YAG laser, e.g., one manufactured by Spectra-Physics, in an oxygen atmosphere of one hundred to five hundred milli-Torrs (100-500 mTorr). It can be appreciated that the ablation temperature, other laser ablation parameters, and deposition time can be adjusted depending on the type of nanotapes being created using this method.

Figure 3:
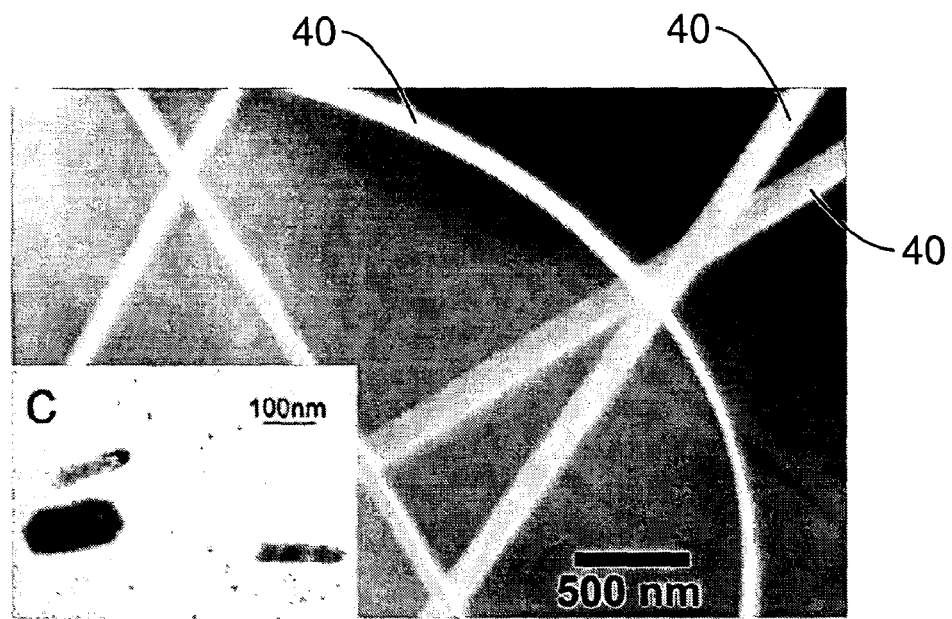
FIG. 3 is a field-emission scanning electron microscopy (FESEM) image of several tin oxide ($SnO_2$) nanoribbons before the deposition of titanium oxide ($TiO_2$).
Figure 4:
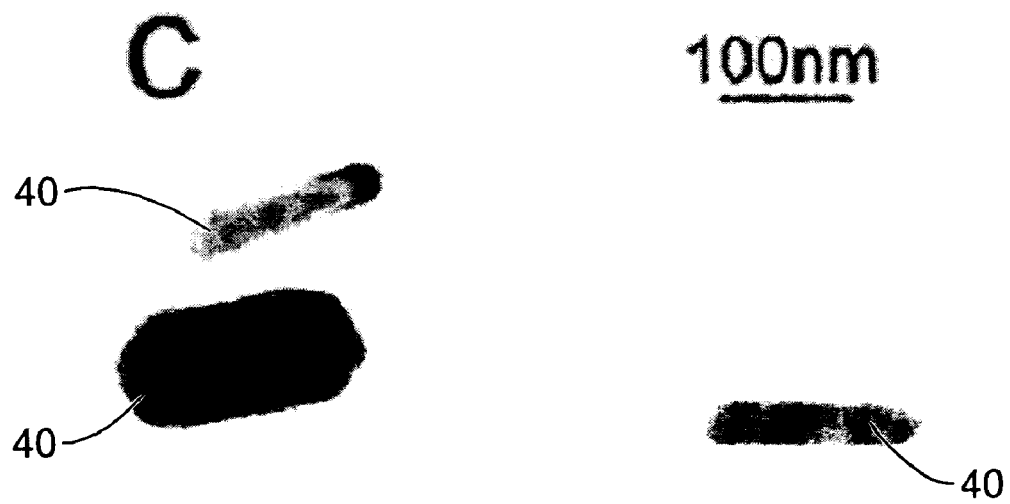
FIG. 4 is a cross-sectional transmission electron microscopy (TEM) image of several $SnO_2$ nanoribbons before the deposition of $TiO_2$.

As stated above, in one non-limiting, exemplary embodiment, the nanoribbon 10 is a rutile $SnO_2$ nanoribbon that can be synthesized using procedures well known in the art. An example of a procedure for fabricating suitable nanoribbons is described in Pan, Z. et al. "Nanobelts of semiconducting oxides", Science, 2001, 291, pp. 1947-1949. The synthetic method for making rutile $SnO_2$ nanoribbons yields a high aspect ratio (i.e., 100-2000) of single-crystalline nanoribbons with <101> growth directions and well-faceted nearly rectangular cross-sections bounded by {10$\bar{1}$} and {010} surface planes. FIG. 3, for example, is a field-emission scanning electron microscopy (FESEM) image of tin oxide ($SnO_2$) nanoribbons, designated 40, before the deposition of titanium oxide ($TiO_2$). As shown in FIG. 3, the pure $SnO_2$ nanoribbons 40 have a relatively smooth morphology. Moreover, FIG. 4 shows that each nanoribbon 40 has a nearly rectangular cross-section. It is to be understood that the dimensions of the nanoribbons 40 shown in FIG. 4 average thirty nanometers by one-hundred and twenty nanometers (30 nm×120 nm). Moreover, the wide and narrow sides of a given nanoribbon 40 adopt either the {010} or {10$\bar{1}$} planes.

It can be appreciated that the crystalline perfection and atomically flat facets of the nanoribbons 40 shown in FIG. 3 and FIG. 4 make them excellent substrates for the epitaxial growth of materials with appropriate crystal symmetries. Further, the good thermal stability of these oxide nanoribbons is equally important to their versatility as substrates because they can survive the harsh conditions typically required for vapor deposition processes.

Figures 5, 6:
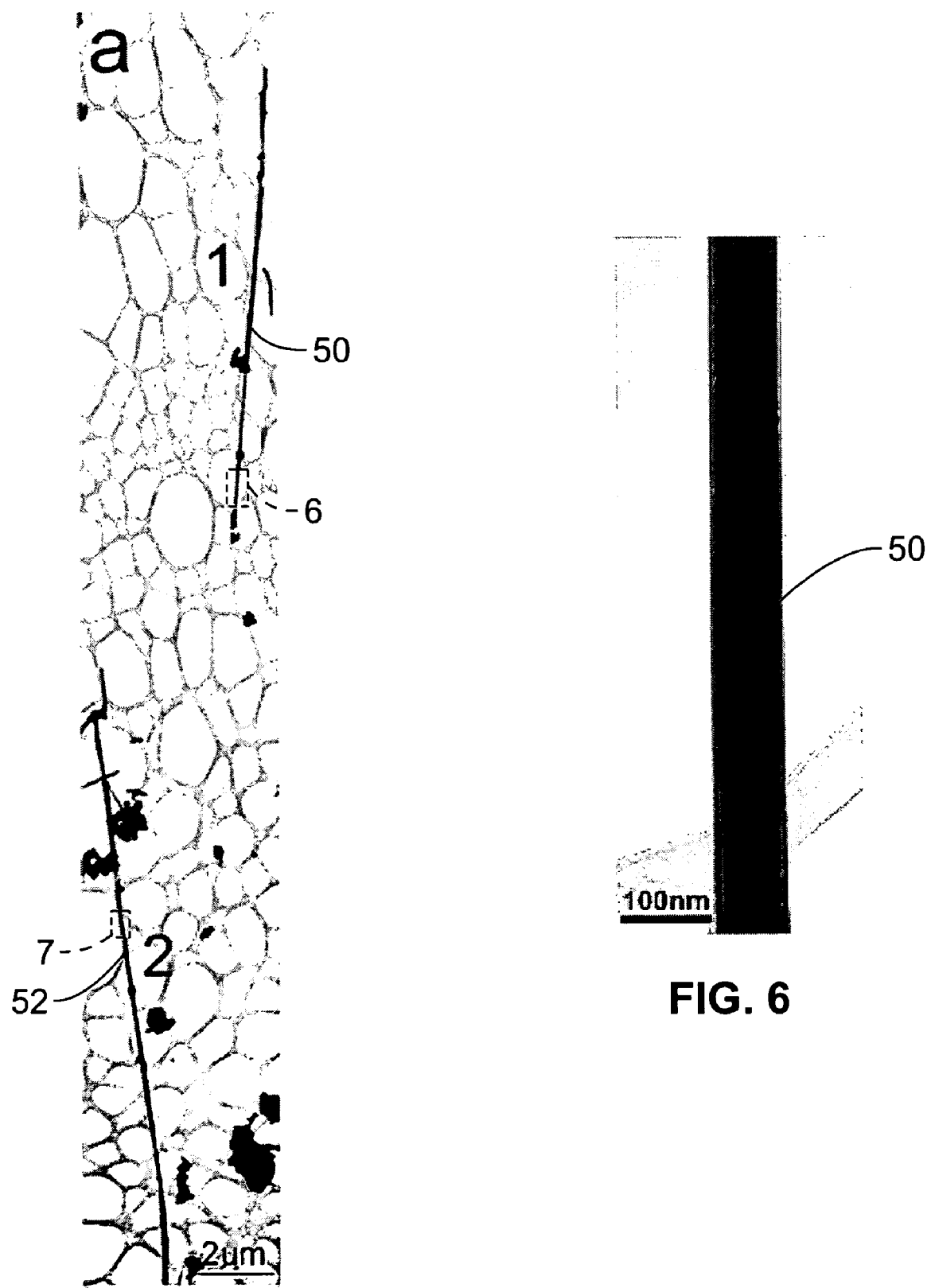
FIG. 5 is a TEM image of two $SnO_2$ nanoribbons before the deposition of $TiO_2$ on the nanoribbons.
FIG. 6 is a TEM image of the nanoribbon within dashed box 6 in FIG. 5.
Figure 7:
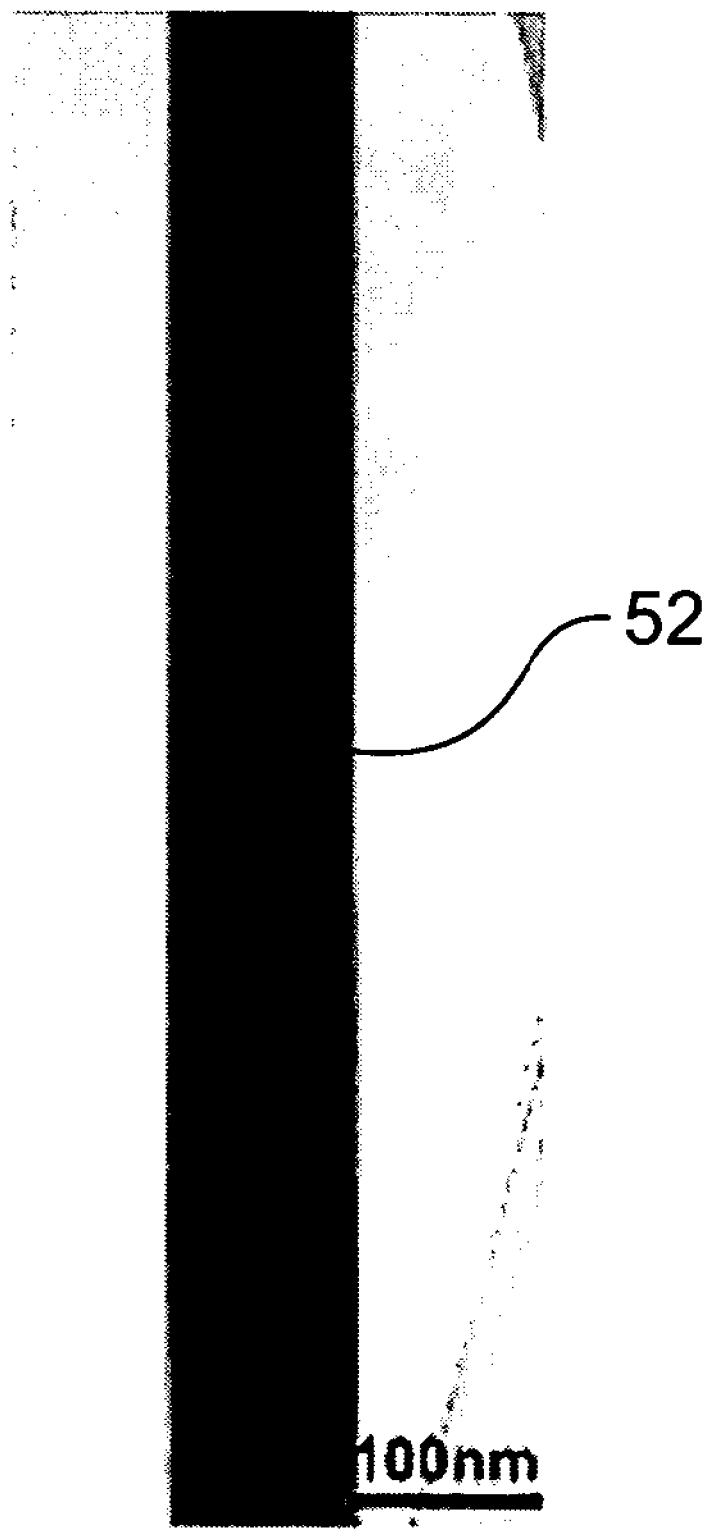
FIG. 7 is a TEM image of the nanoribbon within dashed box 7 in FIG. 5.

FIG. 5 shows a TEM image of a first nanoribbon 50 and a second nanoribbon 50. As shown, the first and second nanoribbons 50, 52 have different wide side planes. FIG. 6 is a TEM image of the first nanoribbon 50 at dashed box 6 in FIG. 5. As shown in FIG. 6, the first nanoribbon 50 has a (010) wide surface and a (10$\bar{1}$) narrow surface. FIG. 7 is a TEM image of the second nanoribbon 52 at dashed box 7 in FIG. 5. As shown, in contrast to the first nanoribbon 50, the second nanoribbon 52 has a (10$\bar{1}$) side surface and a (010) narrow surface.

Figure 8:
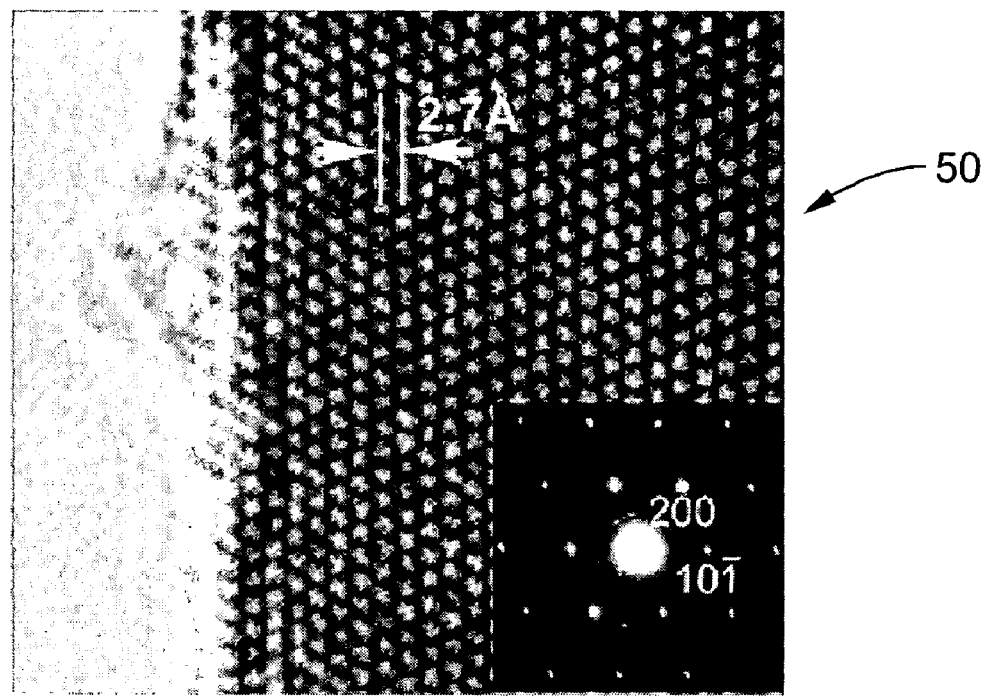
FIG. 8 is a high resolution TEM image of the nanoribbon shown in FIG. 6.
Figure 9:
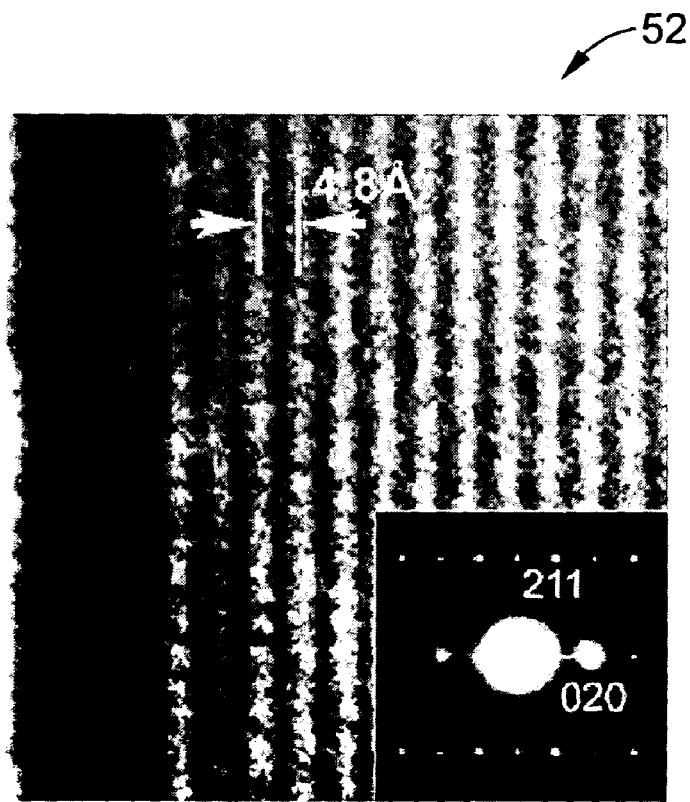
FIG. 9 is a high resolution TEM image of the nanoribbon shown in FIG. 7.

Referring now to FIG. 8 and FIG. 9, high resolution TEM images of the first and second nanoribbons 50, 52, shown in FIG. 5 through FIG. 7, are shown. FIG. 8 and FIG. 9 shows a lattice spacing of two and seven-tenths angstroms (2.7 Å) and four and eight-tenths angstroms (4.8 Å) between the (10$\bar{1}$) and (010) planes. The corresponding electrons diffractions, inset in FIG. 8 and in FIG. 9, further confirm these structural assignments. The present data was recorded using a Philips CM 200 transmission electron microscope operated at two hundred kiloelectron volts (200 keV).

Figure 10:
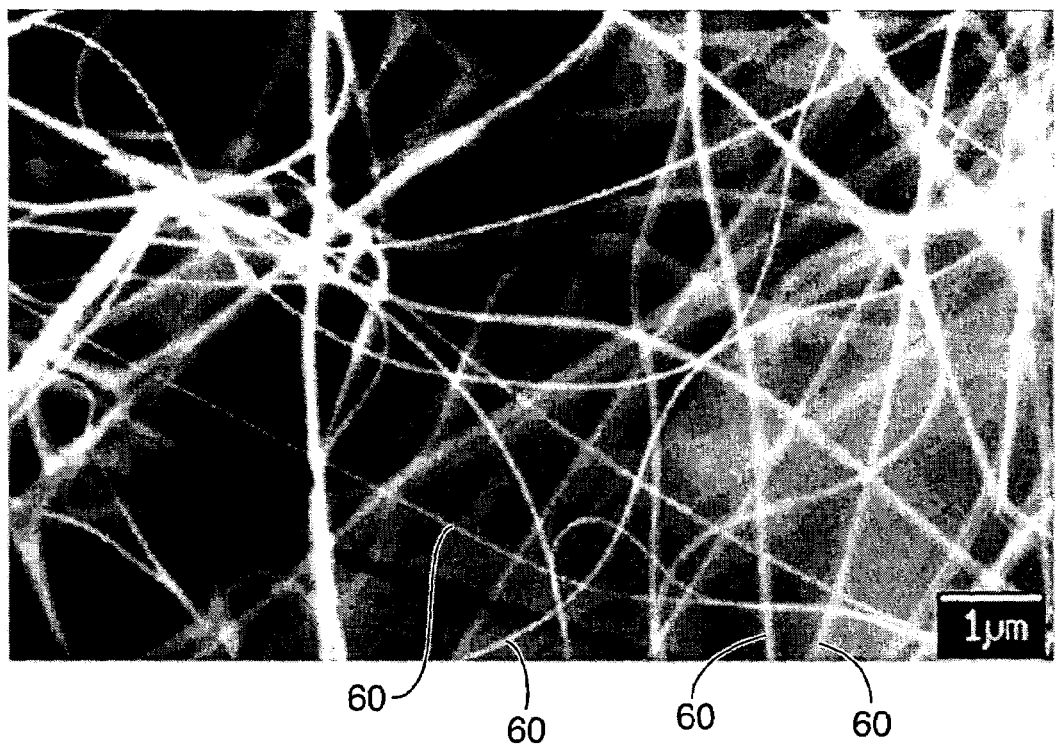
FIG. 10 is a SEM image of a group of $TiO_2$@$SnO_2$ nanotapes.

FIG. 10 shows a group of nanotapes 60, i.e., nanoribbons on which an oxide, e.g., $TiO_2$, has been deposited, as described in detail above. It is to be understood that during the ablation process only one wide plane of a given nanoribbon is typically coated. Moreover, the outermost ribbons in a collection of nanoribbons can intercept most of the assorted material in the laser plume and as such, many of the inner ribbons can be coated uniformly. Further, it is to be understood that after the deposition process the overall ribbon morphology is maintained. However, it is to be understood that the average nanoribbon thickness increases as a result of the deposition of the oxide, e.g., $TiO_2$.

Figure 11:
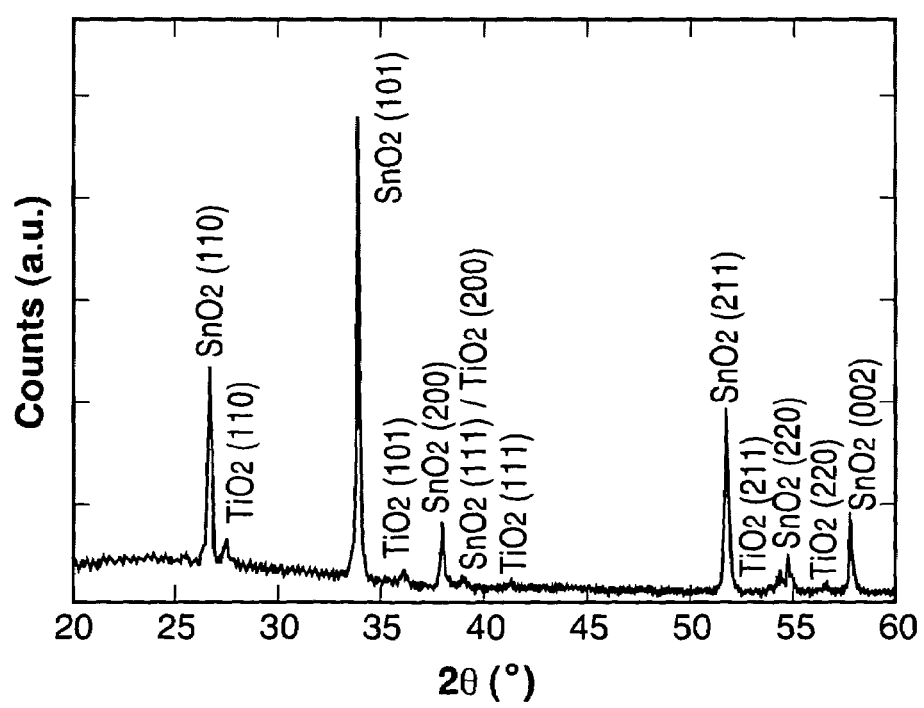
FIG. 11 is a graph showing the X-ray diffraction pattern of a $TiO_2$@$SnO_2$ nanotape according to the present invention.

Referring briefly to FIG. 11, a graph of the X-ray diffraction pattern of a $TiO_2$@$SnO_2$ nanotape created according to the present method. As show in FIG. 11, there are two sets of diffraction peaks that correspond to the rutile $SnO_2$ and $TiO_2$ structures, with no other phases present.

Figure 12:
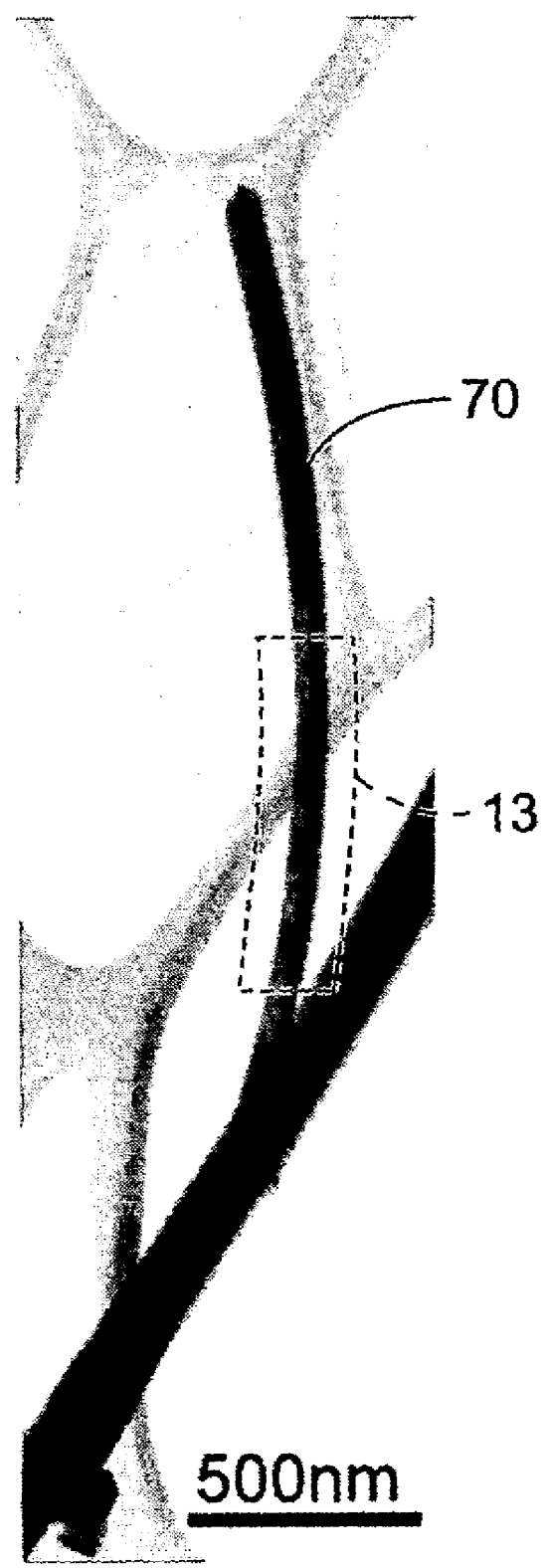
FIG. 12 is a TEM image of a $TiO_2$@$SnO_2$ nanotape according to the present invention.

FIG. 12 shows a TEM image of a $TiO_2$@$SnO_2$ nanotape 70 made according to the method of the present invention. The $TiO_2$@$SnO_2$ nanotape 70 shown in FIG. 12 was made by ablating a sintered $TiO_2$ target at six hundred degrees Celsius (600° C.) in five hundred millitorr (500 mTorr) of flowing $O_2$ for two to eight minutes (2-8 min) using a frequency-doubled Nd:YAG laser operating at twenty to fifty milliJoules per pulse (20-50 mJ/pulse) and three to ten hertz (3-10 Hz).

Figure 13:
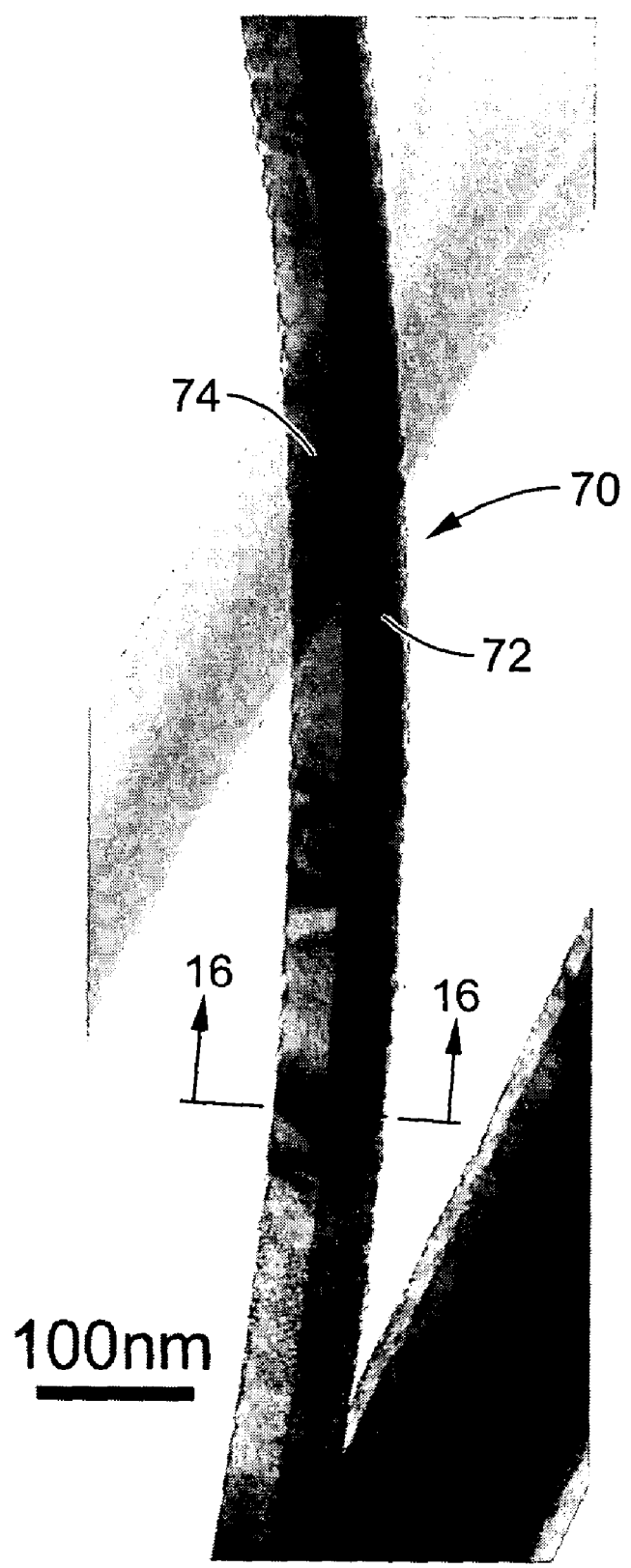
FIG. 13 is a TEM image of the $TiO_2$@$SnO_2$ nanotape shown in FIG. 12 taken at dashed box 13 in FIG. 12.

FIG. 13 is a TEM image of the $TiO_2$@$SnO_2$ nanotape 70, shown in FIG. 12, taken at dashed box 13 in FIG. 12. As shown in FIG. 13, the nanotape 70 includes a nanoribbon 72 and a layer 74 deposited thereon. The clean and sharp laminated morphology of the nanotape 70 can easily be appreciated. Also, it is to be understood that the layer 74 on the nanoribbon 72 is essentially single-crystalline.

Figure 14:
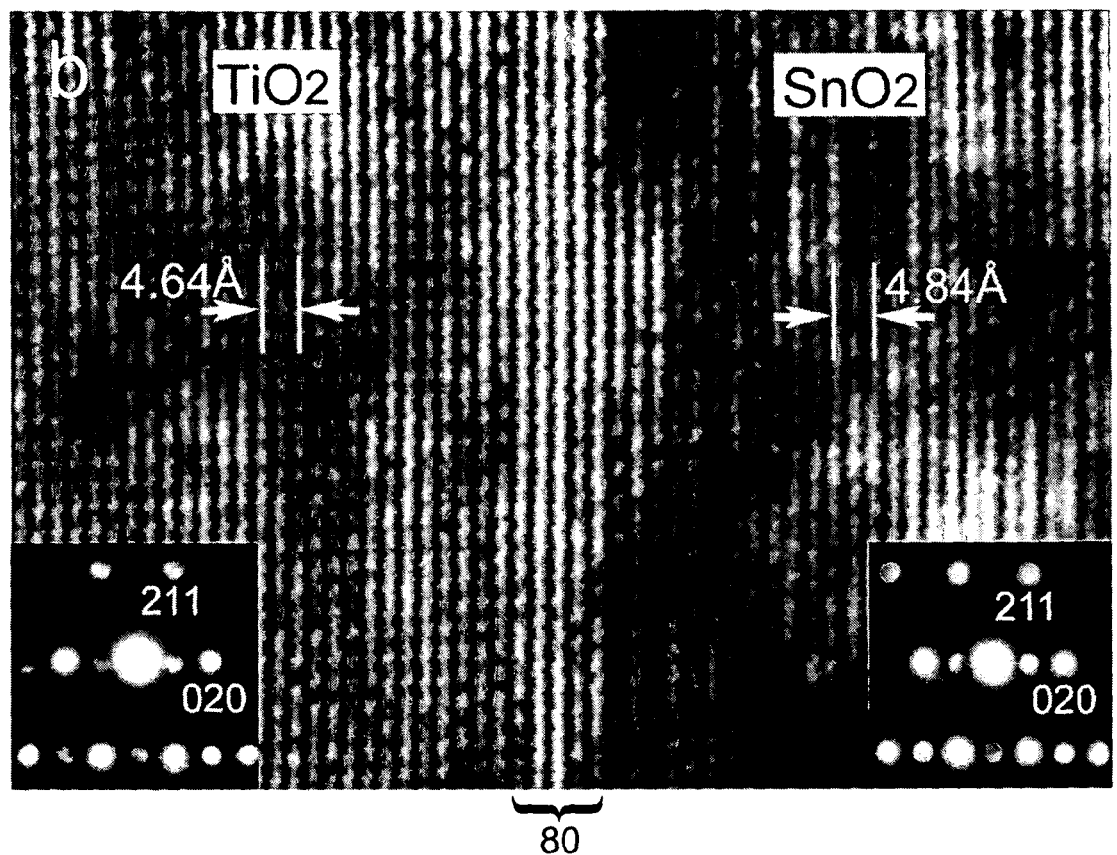
FIG. 14 is a high resolution TEM image of a $TiO_2$@$SnO_2$ interface.
Figure 15:
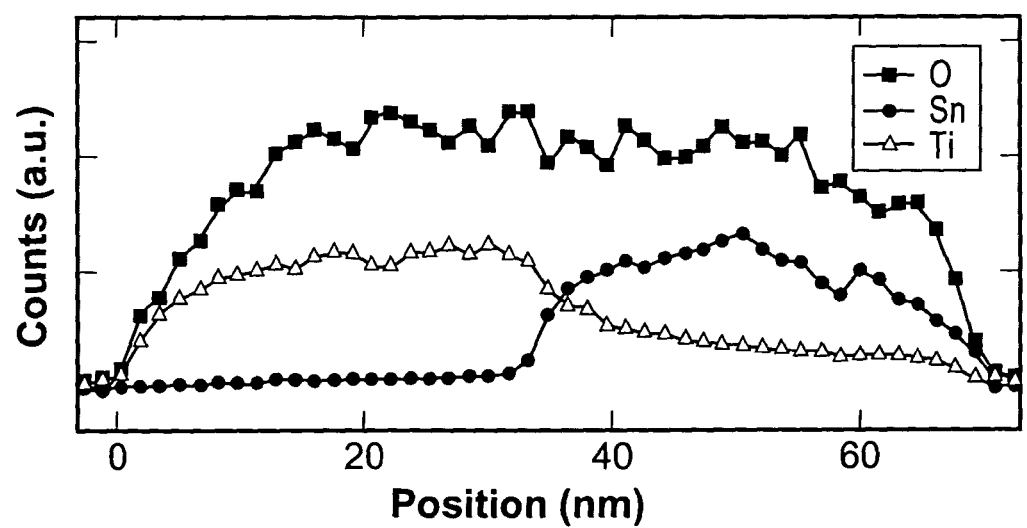
FIG. 15 is a graph showing a compositional line profile across the $TiO_2$@$SnO_2$ nanotape according to the present invention.

Referring now to FIG. 14, a high resolution TEM image of an $TiO_2$@$SnO_2$ interface, designated 80, is shown. The epitaxial nature of the interface is clearly shown in FIG. 14. The deposition of the $TiO_2$, on an $SnO_2$ nanoribbon, results in an atomically sharp interface 80 between the $TiO_2$ and the $SnO_2$. The particular nanotape shown in FIG. 14 has the $TiO_2$ epitaxially oriented on the narrow side (010) surface. The different lattice spacings for the two (010) planes of the rutile $TiO_2$ and $SnO_2$ structures are shown in FIG. 14. As shown, the lattice spacing for the (010) plane of the $TiO_2$ is approximately four and sixty-four one hundreds angstroms (4.64 Å) and the lattice spacing for the (010) plane of the $SnO_2$ is approximately four and eighty-four one hundreds angstroms (4.84 Å). The electron diffraction taken in the two sides of the interface, see the insets on each side of FIG. 14, further demonstrate than an excellent epitaxial relationship is established between the $TiO_2$ and the $SnO_2$. Moreover, FIG. 15 shows a line profile of the elemental composition perpendicular to the tape axis taken at line 16-16 from the left to the right. FIG. 15 clearly shows an anisotropic bi-layer nanotape structure with a smooth interface and an external surface.

Figure 16:
FIG. 16 is a cross-sectional transmission electron microscopy (TEM) image of a $TiO_2$@$SnO_2$ nanotape according to the present invention taken at line 16-16 in FIG. 13.
Figure 17:
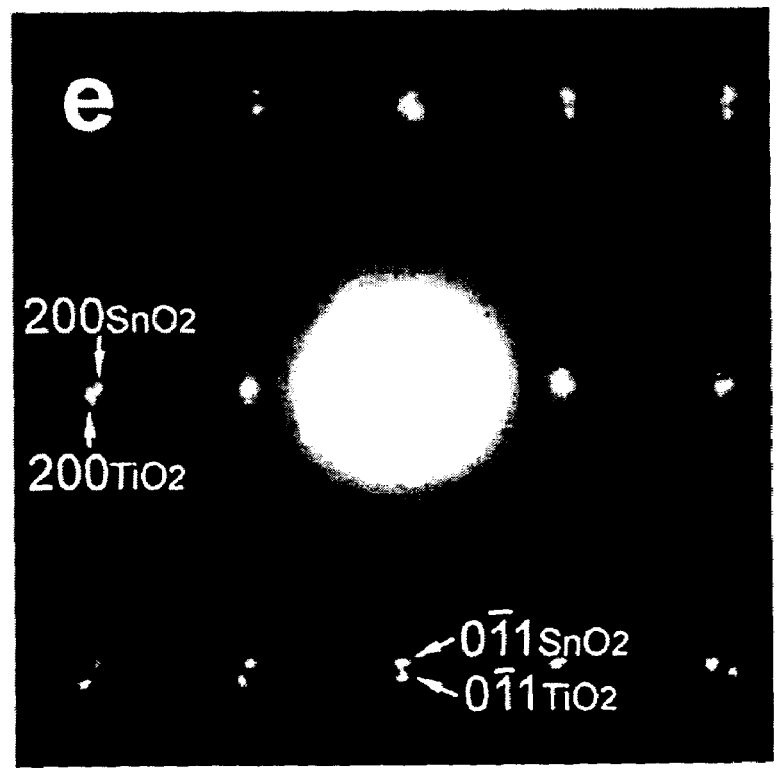
FIG. 17 is a selected area electron diffraction pattern recorded at the cross-section area shown in FIG. 16.

FIG. 16 is a cross-sectional TEM image of the $TiO_2$@$SnO_2$ nanotape 70 shown in FIGS. 12 and 13. As shown in FIG. 16, the nanotape 70 has a quasi-rectangular cross-section and a bi-layer morphology. FIG. 17 shows the electron diffraction recorded at the cross-section area shown in FIG. 16. The diffraction at the interface again shows only two sets of well-correlated diffraction patterns that indicate the excellent interfacial epitaxial relationship between the $TiO_2$ and the $SnO_2$.

It is to be understood that, typically, the $TiO_2$ is epitaxially grown on the wide side (10$\bar{1}$) plane of a nanoribbon. Moreover, it can be appreciated that the epitaxy observed in the $TiO_2$@$SnO_2$ nanotapes is reasonable considering the relatively small lattice mismatch (2.9% for a and 7.0% for c) between the $TiO_2$ and $SnO_2$ rutile structures. However, the TEM studies do indicate the existence of interfacial stress in these bimorph structures. It can be appreciated that the energetic nature of a laser ablation process, e.g., the process described above, makes the plume highly directional and enables the selective film deposition on one side of a nanoribbon substrate due to the shadow effect.

Figure 18:
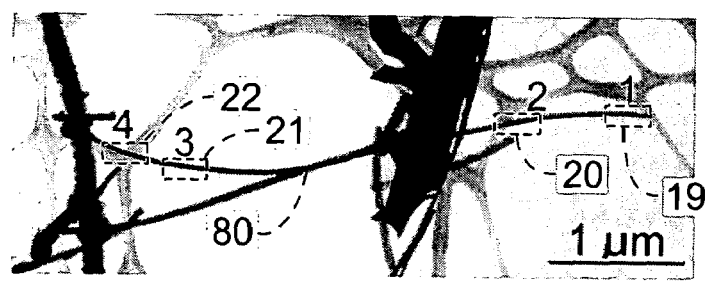
FIG. 18 is a TEM image of an approximately five micrometer (5 μm) $Co_{0.05}Ti_{0.95}O_2$@$SnO_2$ nanotape according to the present invention.

Referring to FIG. 18, a TEM image of an approximately five micrometer (5 μm) $Co_{0.05}Ti_{0.95}O_2$@$SnO_2$ nanotape, designated 80, is shown. It is to be understood that the $Co_{0.05}Ti_{0.95}O_2$@$SnO_2$ nanotape 80 shown in FIG. 18 can be manufactured using the method steps described above in conjunction with FIG. 2. Specifically, the $Co_{0.05}Ti_{0.95}O_2$@$SnO_2$ nanotape 80 can be manufactured by ablating a $Co_{0.05}Ti_{0.95}O_2$ target at seven hundred degrees Celsius (700° C.) in one-hundred and twenty-five milliTorrs (125 mTorr) of $O_2$.

Figure 19:
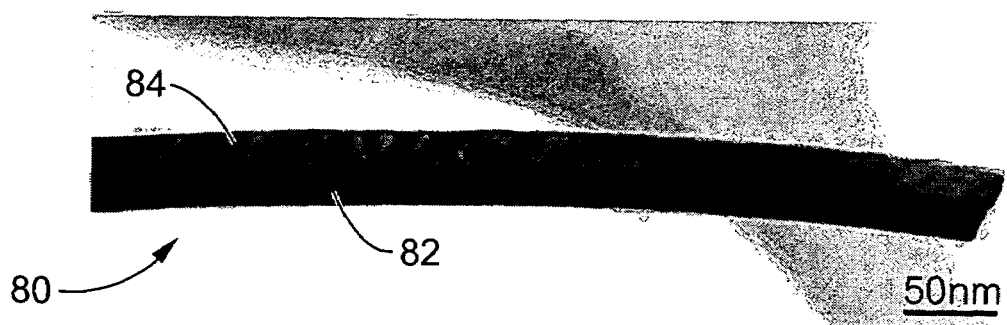
FIG. 19 is a TEM image of the $Co_{0.05}Ti_{0.95}O_2$@$SnO_2$ nanotape shown in FIG. 18 taken at dashed box 19 in FIG. 18.
Figure 20:
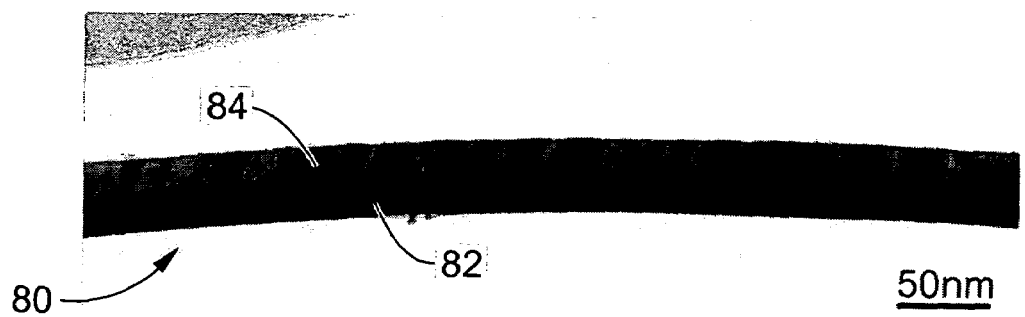
FIG. 20 is a TEM image of the $Co_{0.05}Ti_{0.95}O_2$@$SnO_2$ nanotape shown in FIG. 18 taken at dashed box 20 in FIG. 18.
Figure 21:
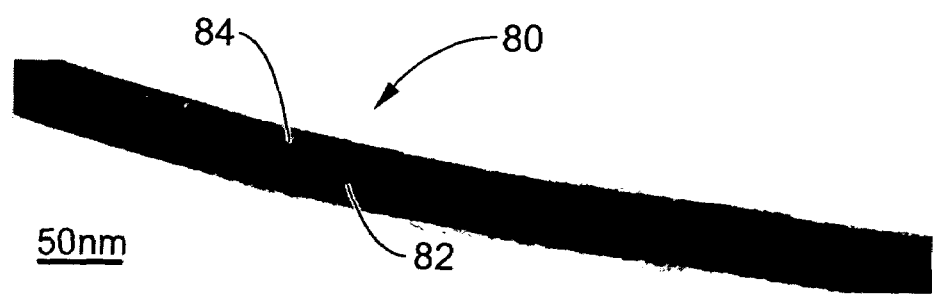
FIG. 21 is a TEM image of the $Co_{0.05}Ti_{0.95}O_2$@$SnO_2$ nanotape shown in FIG. 18 taken at dashed box 21 in FIG. 18.
Figure 22:
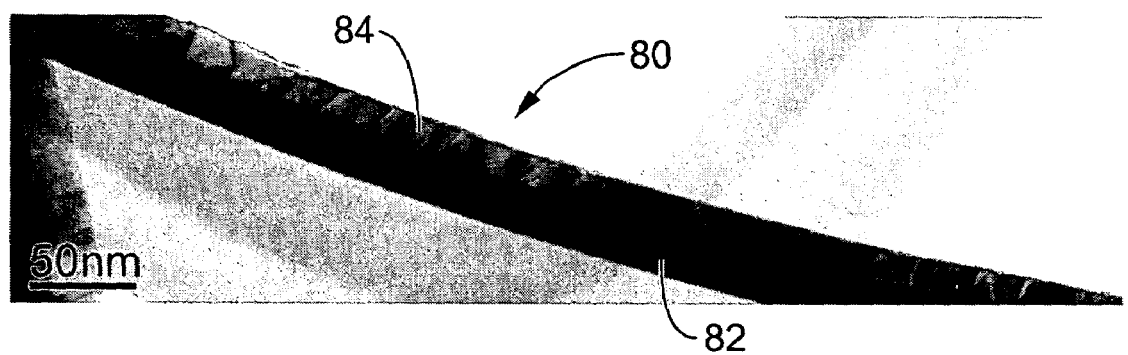
FIG. 22 is a TEM image of the $Co_{0.05}Ti_{0.95}O_2$@$SnO_2$ nanotape shown in FIG. 18 taken at dashed box 22 in FIG. 18.

FIG. 19 is a TEM image of the $Co_{0.05}Ti_{0.95}O_2$@$SnO_2$ nanotape 80 taken at dashed box 19 in FIG. 18. FIG. 20 is a TEM image of the $Co_{0.05}Ti_{0.95}O_2$@$SnO_2$ nanotape 80 taken at dashed box 20 in FIG. 18. Moreover, FIG. 21 is a TEM image of the $Co_{0.05}Ti_{0.95}O_2$@$SnO_2$ nanotape 80 taken at dashed box 21 in FIG. 18. And, FIG. 22 is a TEM image of the $Co_{0.05}Ti_{0.95}O_2$@$SnO_2$ nanotape 80 taken at dashed box 22 in FIG. 18.

In each of the images shown in FIG. 19 through FIG. 22, it can be seen that the $Co_{0.05}Ti_{0.95}O_2$@$SnO_2$ nanotape 80 includes a $SnO_2$ nanoribbon 82 on which a $Co_{0.05}Ti_{0.95}O_2$ layer 84 has been deposited, using the method described in detail above. Moreover, the highly crystalline nature of the entire approximately five micrometer (5 μm) $Co_{0.05}Ti_{0.95}O_2$@$SnO_2$ nanotape 80 can easily be seen in FIG. 19 through FIG. 22. Additionally, the abrupt interface between the $SnO_2$ nanoribbon 82 and the $Co_{0.05}Ti_{0.95}O_2$ layer 84, and the smooth and uniform coating of the $Co_{0.05}Ti_{0.95}O_2$ layer 84 are clearly shown in FIG. 19 through FIG. 22.

Figure 23:
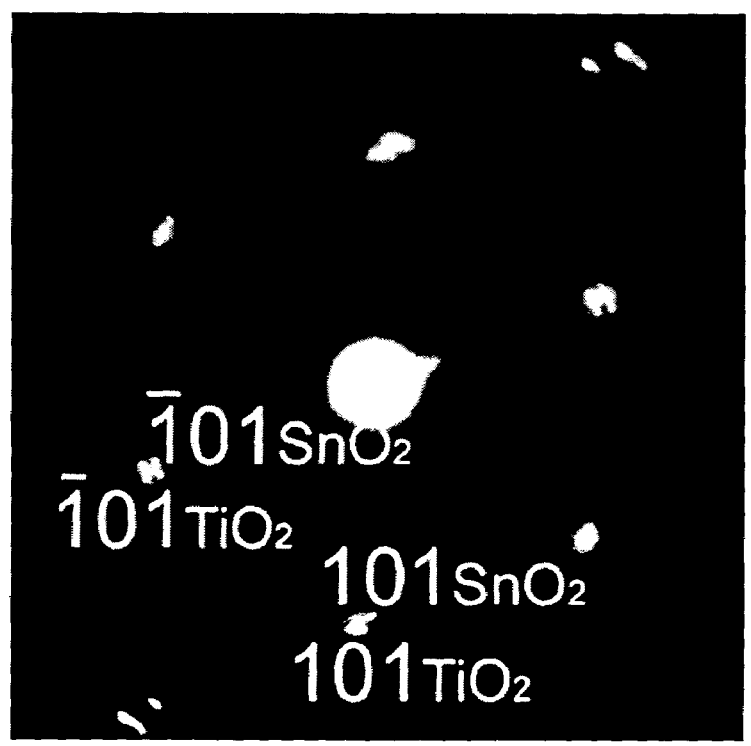
FIG. 23 is an electron diffraction pattern recorded at the interface of the $Co_{0.05}Ti_{0.95}O_2$ and the $SnO_2$ comprising the $Co_{0.05}Ti_{0.95}O_2$@$SnO_2$ nanotape shown in FIG. 18.

FIG. 23 shows the electron diffraction recorded at the interface of the $Co_{0.05}Ti_{0.95}O_2$ layer 84 and the $SnO_2$ nanoribbon 82 comprising the $Co_{0.05}Ti_{0.95}O_2$@$SnO_2$ nanotape 80 shown in FIG. 18 through FIG. 22. The diffraction at the interface shows only two sets of well-correlated diffraction patterns that indicate the excellent interfacial epitaxial relationship between the transition metal doped $TiO_2$, e.g., $Co_{0.05}Ti_{0.95}O_2$, and the $SnO_2$.

Figure 24:
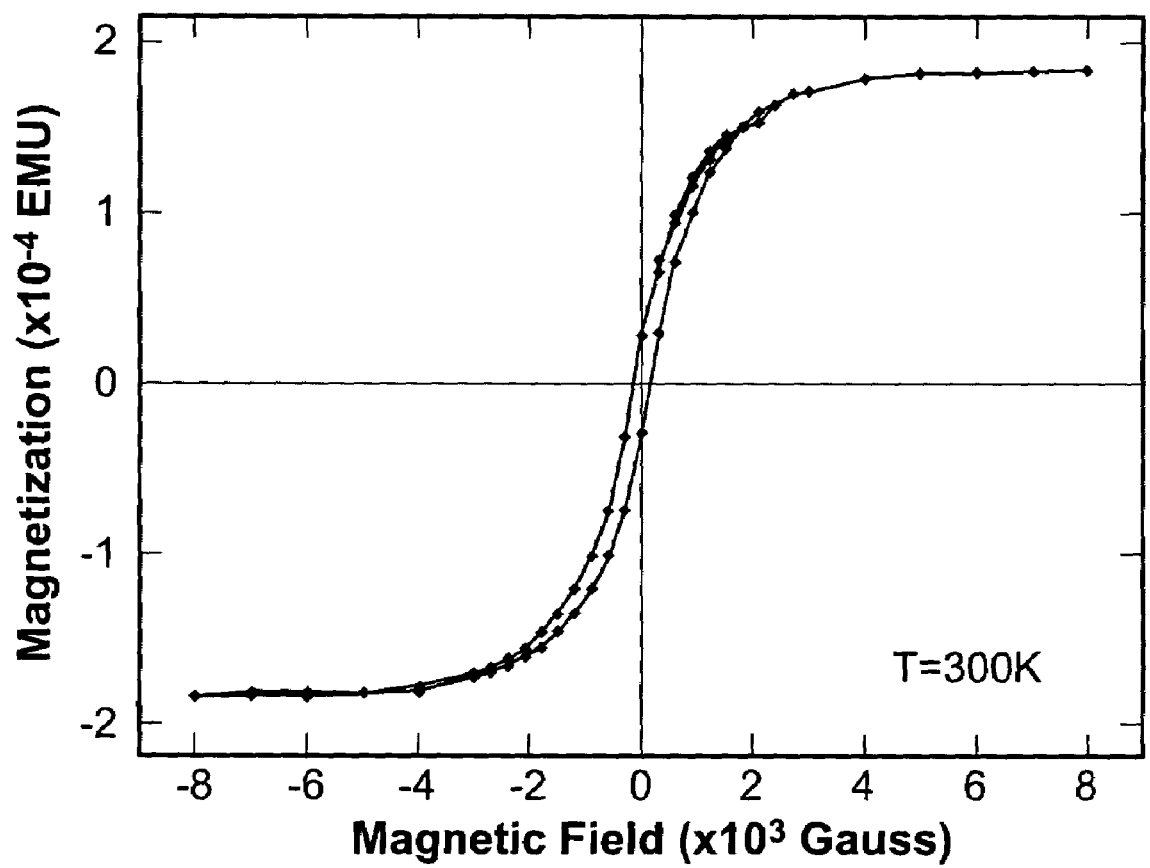
FIG. 24 is a graph of the magnetization versus the magnetic strength for a $Co_{0.05}Ti_{0.95}O_2$@$SnO_2$ nanotape produced according to the present invention.

It is to be understood that a $Co_{0.05}Ti_{0.95}O_2@SnO_2$ nanotape manufactured according to the method of the present invention is ferromagnetic. FIG. 24 is a graph of the magnetization versus the magnetic strength for a $Co_{0.05}Ti_{0.95}O_2@SnO_2$ nanotape produced according to the present invention. It is to be further understood that the formation of other phases, e.g., $CoTiO_3$, $CoTi_2O_5$, Co and CoO, has not been observed by any of the electron microscopy and X-ray diffraction studies undertaken during the development of the present invention. This is most likely due to the nature of the nanoscale epitaxial growth of the method of the present invention and implies that the origin of the room temperature ferromagnetism in the $Co_{0.05}Ti_{0.95}O_2@SnO_2$ nanotapes is intrinsically related to the Co doped $TiO_2$.

Although the foregoing discussion focuses on $TiO_2@SnO_2$ nanotapes and methods for making these nanotapes, it will be appreciated the method of the present invention is highly versatile. For example, using the method of the present-invention, transition metal doped ZnO, e.g., $Mn_{0.1}Zn_{0.9}O$ and $Ni_{0.1}Zn_{0.9}O$, has been successfully deposited on ZnO nanowires/nanoribbons to form homo-junctioned ZnO nanotapes. Moreover, it can be possible to fabricate highly crystalline nanotapes or core-shell structures of many other complex materials using different metal oxide nanoribbons (e.g., ZnO, MgO, $Al_2O_3$, Si, GaN, CdS) as substrates.

Important features of the above-described, nanoribbon-based approach to lateral heterostructure formation include the flexibility in choosing the materials, the synthetic simplicity of the present method, and the high-quality epitaxial structures manufactured using the present method. The possible nanotape functionalities are essentially unlimited and can include luminescent properties, ferromagnetic properties (depositing, e.g., transition metal dope $TiO_2$, ZnO, and $LaMnO_3$), ferroelectric properties (depositing, e.g., $BaTiO_3$ and $PbTiO_3$) and superconducting properties (depositing, e.g., $YBa_2Cu_3O_z$).

Furthermore, it will be appreciated that mechanical, thermal and chemical properties of interfaces play a vital role in technologies ranging from adhesives to electronics. As device dimensions shrink and nanostructured materials are made increasingly complex, the behavior of solid-solid interfaces in nanoscopic systems grows in importance. The bulk of the techniques used in interface studies are primarily applicable to thin films on large, thick substrates. Therefore, an experimental approach capable of providing detailed, dynamic chemical and structural information on interfaces in individual nanostructures in real time would be useful.

Accordingly, another aspect of the invention is the in-situ TEM observation of bilayer nanoribbons (nanoscale bimetallic strips) as a powerful approach to studying in detail the dynamics of ultrathin films confined to nanoscopic substrates. Here, single crystalline nanoribbons or nanowires are used as substrates for the deposition of a second material, yielding structures with an interface parallel to the nanowire growth axis. Since practically any two materials can be joined using one of a variety of directional gas-phase synthesis methods, the bilayer nanowire platform is extremely versatile. It also offers the advantage of studying interfaces in real time using direct observation without the need for preparation of the interface in any way. In other words, using in situ TEM coupled with bilayer nanowires, it is possible to observe how as-grown, dimensionally confined interfaces respond to thermal, mechanical and electrical stresses.

We now describe the synthesis, characterization and bending behavior of thin layers of copper on $SnO_2$ nanoribbons. These are the world's smallest bimetallic beams.

EXAMPLE 1

As a model system with implications in catalysis and thin-film growth theory, bilayer structures of copper on $SnO_2$ nanoribbons ($Cu@SnO_2$) were synthesized by the thermal evaporation of approximately 5 nm to 50 nm of copper onto freestanding nanoribbons at room temperature. By controlling the incidence angle of the metal flux it was possible to coat predominantly a single surface of a quasi-rectangular nanoribbon with a continuous copper film as (see Example 4 below). Surprisingly, we found that this procedure resulted in distinct bilayer structures depending on which of the two $SnO_2$ nanoribbon facets served as the growth surface. Copper deposited on the $(10\bar{1})_{SnO2}$ surface grew as a polycrystalline film, whereas a highly crystalline and epitaxial layer formed on the $(010)_{SnO2}$ plane.

Figure 25:
FIG. 25 is a low-resolution TEM image of two large $SnO_2$ nanoribbon templates.
Figure 26:
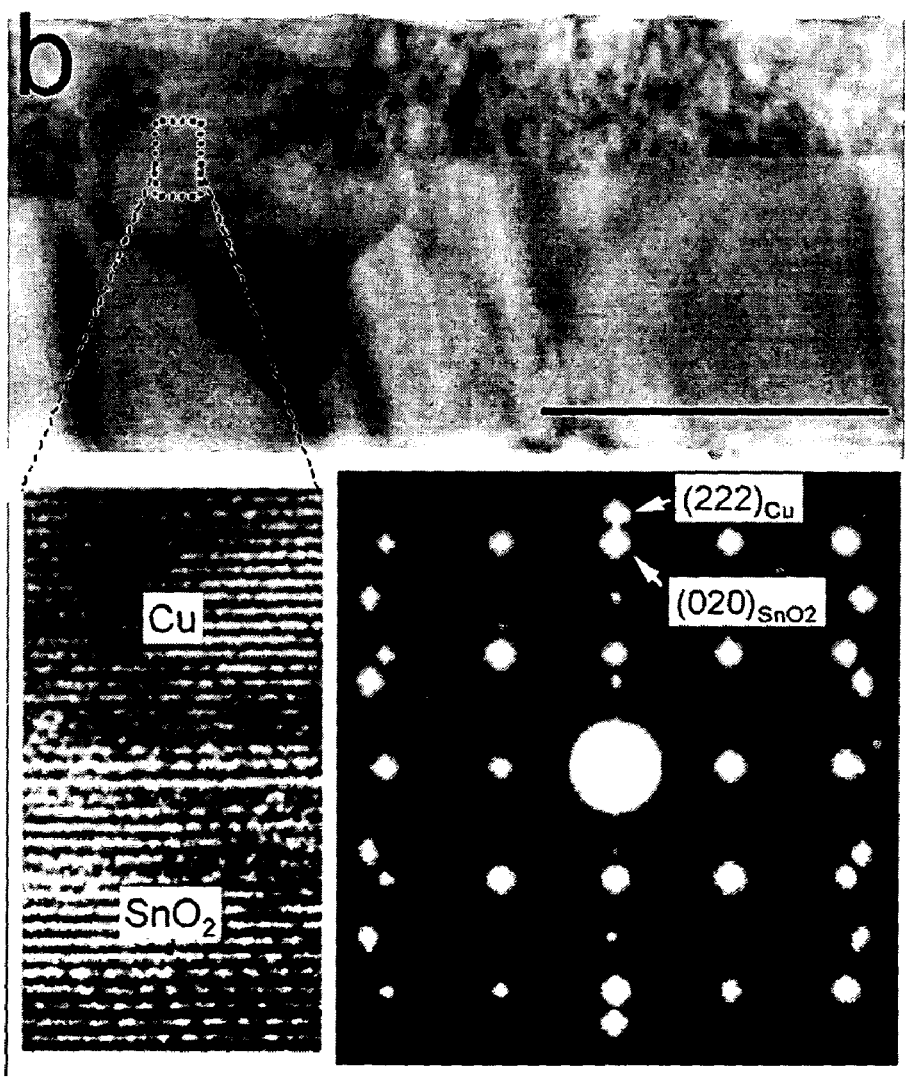
FIG. 26 is a TEM characterization of an epitaxial Cu@$SnO_2$ bilayer nanoribbon.
Figure 27:
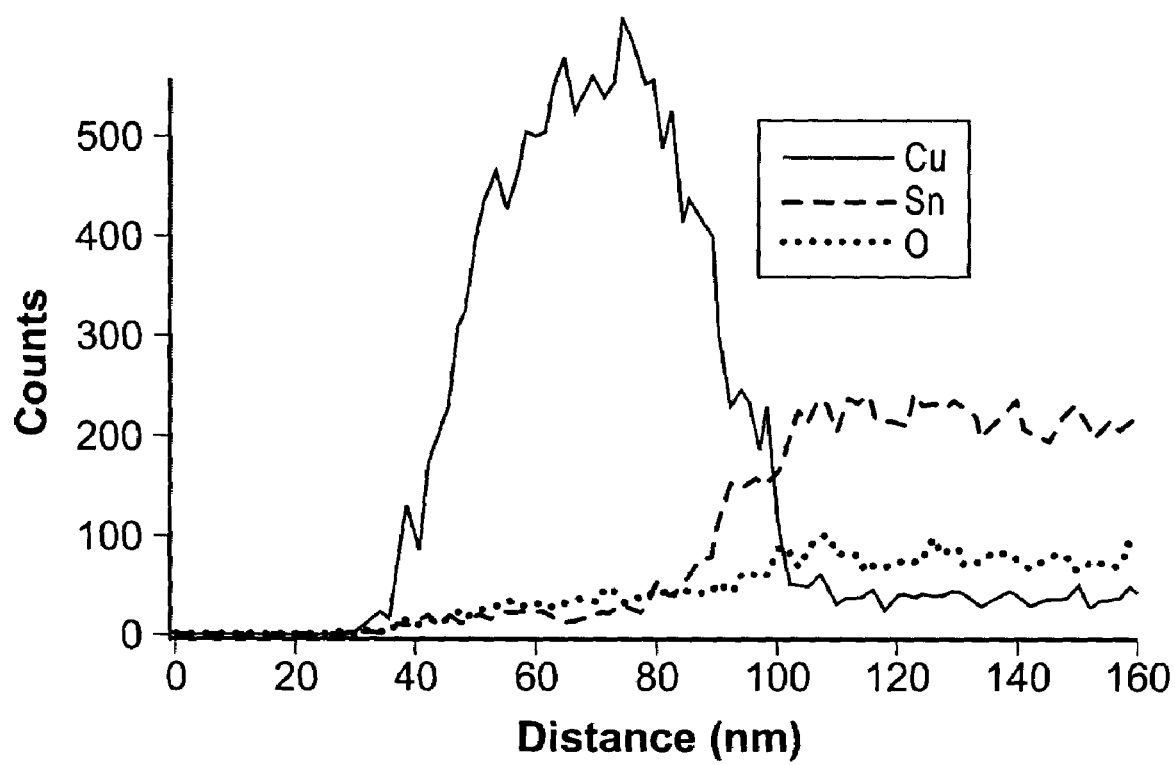
FIG. 27 is an EDS elemental profile of a large bilayer showing the qualitative distribution of copper, tin and oxygen across the interface.
Figure 28:
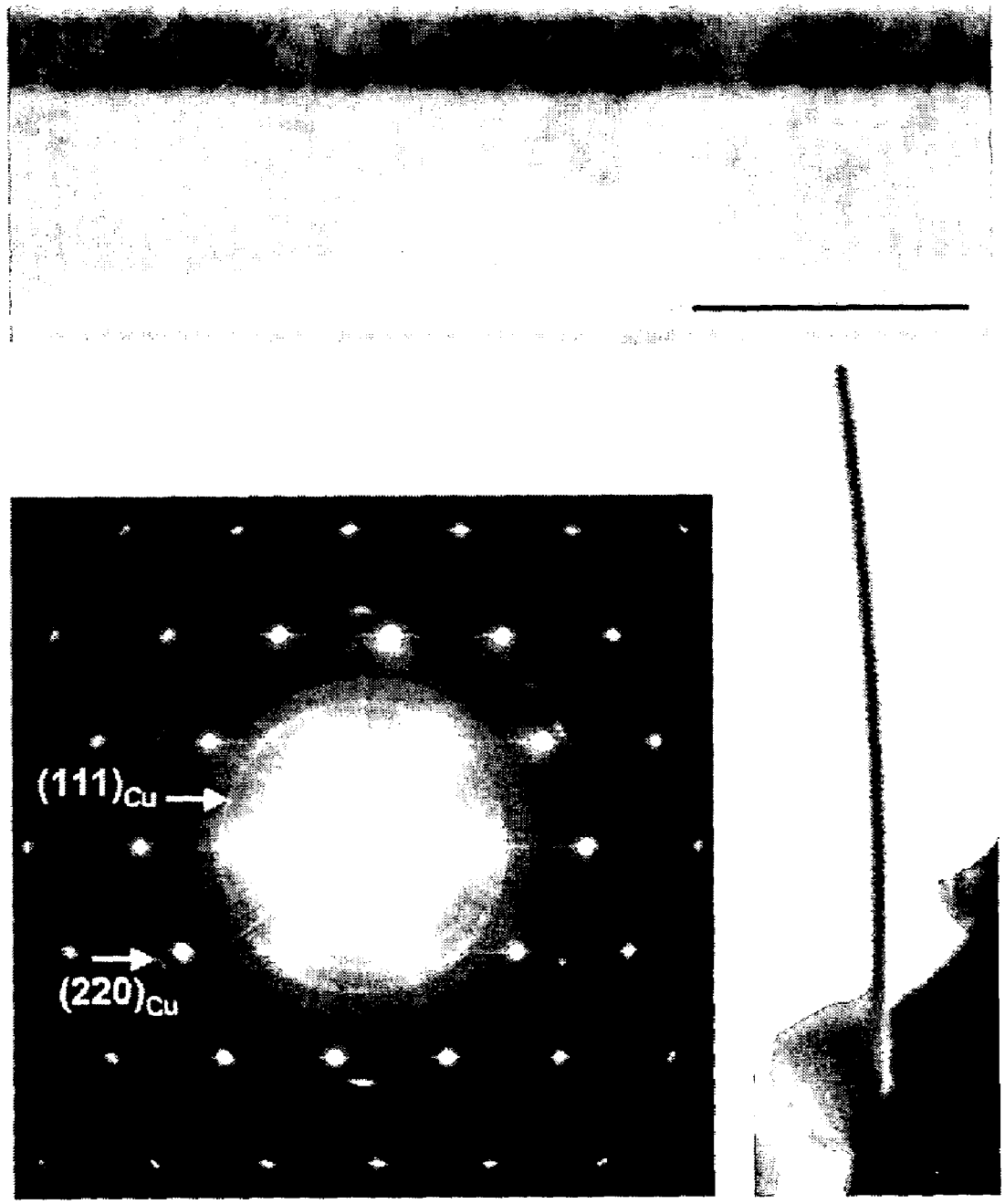
FIG. 28 is a TEM characterization of polycrystalline Cu@$SnO_2$ bilayers.

FIG. 25 through FIG. 28 provide TEM characterization of these two bilayer morphologies. FIG. 25 is a low-resolution TEM image of two large $SnO_2$ nanoribbon templates. The inset is a cross-section showing the quasi-rectangular faceting of the nanoribbons, which are bound by (010) and (10$\bar{1}$)surface planes. FIG. 26 is a TEM characterization of an epitaxial $Cu@SnO_2$ bilayer nanoribbon. The top is a typical low-magnification image of the bilayer interface, with $SnO_2$ below copper. The scale bar=100 nm. The lattice-resolved image demonstrates the atomic smoothness of the metal-to-oxide interface. Selected area electron diffraction along the $SnO_2$[101] zone axis shows that the copper layer is largely single crystalline and grows epitaxially on the $SnO_2(010)$ surface, with Cu(111)∥$SnO_2$(010) and Cu[211]∥$SnO_2$[100]. FIG. 27 is an EDS elemental profile of a large bilayer showing the qualitative distribution of copper, tin and oxygen across the interface. EDS linescans of the bilayers presented here often revealed a discontinuous layer of copper on one basal surface in addition to the main copper layer on the side surface. Oxygen contamination in the Cu film was below EDS detection limits. FIG. 28 is a TEM characterization of polycrystalline $Cu@SnO_2$ bilayers. The top is a low-magnification image with copper above $SnO_2$; scale bar=100 nm. Electron diffraction parallel to the $SnO_2$ [010] shows a crystalline $SnO_2$ pattern with copper rings. The bottom right is an image of one of the smallest bilayers studied by in situ TEM thermal cycling. This sample is 8.3 nm of polycrystalline copper on a 24 nm thick $SnO_2$ substrate, with a length (from fixed end to tip) of 1.77 μm.

Electron diffraction of the as-grown bilayers detected only cubic Cu and rutile $SnO_2$. Copper grains in the polycrystalline bilayers were isotropically distributed and typically as large as the film thickness. The epitaxial copper grains were columnar and several times larger than the film thickness. Oxygen contamination in the copper films was typically below the limit of detection of energy dispersive spectroscopy (EDS).

The room temperature formation of a continuous, epitaxial copper layer on a metal oxide substrate is unexpected since island growth, not layer-by-layer growth, is thought to be the thermodynamically preferred situation for such systems. However, sufficiently low temperature deposition conditions can result in the kinetic trapping of metal films as smooth, continuous layers that completely wet their substrates.

EXAMPLE 2

We performed high temperature bilayer syntheses and in situ heat treatments to show that the initially continuous epitaxial and polycrystalline copper layers evolve into thick islands at temperatures higher than ~225° C., thereby confirming that the Cu@SnO$_2$ bilayer nanoribbons are created in a metastable state. Epitaxy in this and related systems has been documented, though rarely at such low growth temperatures. We rationalize the $(111)_{Cu}//(010)_{SnO2}$ epitaxial relationship in terms of a resulting lattice mismatch of 6.7% in the $[100]_{SnO2}$ direction and 19.8% in the $[001]_{SnO2}$ direction, which is suggestive of domain matching epitaxy. Evidently no comparable relationship exists for copper deposited on the $(10\bar{1})_{SnO2}$ surface.

The Cu@SnO$_2$ bilayers are nanoscale bimetallic strips that bend in response to temperature fluctuations. In principle, the tip of a bimetallic beam composed of two materials with thermal expansion coefficients $\alpha_1$ and $\alpha_2$ and thicknesses $t_1$ and $t_2$ will exhibit a displacement $Z_{tip}$ with heating or cooling given by the continuum expression for macroscopic beams:

$$Z_{tip} = 3(\alpha_1 - \alpha_2)\frac{t_1 + t_2}{t_2^2 K}(T - T_0)\lambda^2$$

where $\lambda$ is the length of the beam, $T-T_0$ is the change in temperature, and K is a term that includes the anisotropic Young's moduli of the two materials. The equation assumes perfect adhesion between the two beam components as well as negligible surface effects (i.e., thick beams relative to atomic dimensions). Nanoscopic bilayers are expected to deviate from the macroscopic expression when one or both of their components are thin enough (typically ~1-3 nm) to experience size-dependent expansion coefficients and moduli.

EXAMPLE 3

We investigated the thermomechanical behavior of individual bilayer nanoribbons by systematically subjecting freestanding beams to temperature cycles from 25-200° C. in situ in a TEM. By recording bilayers continuously under low magnification, we were able to measure tip displacement as a function of temperature for multiple samples of each morphology. For comparison with theory, the appropriate linear expansion coefficients ($16.5 \times 10^{-6} K^{-1}$ for copper and $3.8 \times 10^{-6} K^{-1}$ for SnO$_2$)[1] and anisotropic Young's moduli (131 GPa along $[1\bar{1}0]_{Cu}$ and 184 GPa along $[101]_{SnO2}$, the crystal directions parallel to the long axis of the beam)[2] were treated as temperature-independent, since all values varied by less than 5% in this temperature range.

We found that, while cantilevers with epitaxial copper layers bent reversibly in agreement with the macroscale equations, all polycrystalline structures deviated markedly from ideal behavior on the first thermal cycle and showed either damped oscillations or stable reversibility on subsequent cycles.

EXAMPLE 4

The substrate SnO$_2$ nanoribbons were synthesized by the chemical vapor transport of SnO powder at 1050° C. in an alumina tube in 300 Torr of flowing argon. Silicon (100) substrates placed near the starting material collected cotton-like masses of SnO$_2$ nanoribbons. The nanoribbons were transferred to TEM grids (Cu or Ni mesh, without carbon film) by gently brushing a grid against a nanoribbon sample; no solvents were used.

The coating of copper (99.999%) onto the SnO$_2$ nanoribbons was accomplished by thermal evaporation in a homemade high vacuum chamber ($1 \times 10^{-7}$ Torr base pressure) equipped with a sample heating stage. Two procedures were designed to uniformly coat the entire side surface of the nanoribbon substrates so that the interfaces of the resulting bilayers were correctly oriented for TEM observation (parallel to the electron beam). In the first method, a nanoribbon was suspended with one end approximately 5 µm to 25 µm off the edge of a silicon fragment and coated with copper. The fragment was then rotated 90° and glued to a TEM grid with silver paste, providing a single nanoribbon for observation. Alternatively, several hundred nanoribbons were brushed onto a grid, which was then mounted to the stage on its edge slightly off parallel with respect to the Cu flux. The second method reliably produced 5 to 20 structures per grid with copper coated almost exclusively on a single surface of the rectangular nanoribbon. The deposition pressure was $1-5 \times 10^{-6}$ Torr, with 10-50 nm Cu films coated at a rate of 1.5 MLs$^{-1}$.

In-situ transmission electron microscopy (TEM) experiments were carried out in a JEOL 3010 TEM (300 kV) equipped with a heating stage capable of 1200° C. operation. Temperature was controlled to within 0.1° C. by a resistive heating unit with feedback from a thermocouple mounted directly to the sample holder. Bilayer samples were first precisely aligned along either the $[101]_{SnO2}$ or $[010]_{SnO2}$ zone axis via diffraction and then heated at a rate of 5-10° C. min$^{-1}$ in vacuum ($1 \times 10^{-6}$ Torr) and allowed to equilibrate between measurements. During data acquisition, the sample was maintained at constant low magnification, spread beam conditions to avoid heating effects from the electron beam. No bending or microstructure evolution was observed for bilayers held in the beam at experimental magnification for several hours. Uncoated nanoribbons remained motionless during temperature cycling, indicating that the bending behavior is a property of the bilayer interface and not a result of charging from the electron beam.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A nanotape, comprising:
   a nanoribbon substrate; and
   an oxide epitaxially deposited on a flat surface of the nanoribbon substrate to form a two-layer nanotape having a generally rectangular cross-section.

2. A nanotape as recited in claim 1, wherein the nanoribbon comprises a material selected from the group consisting essentially of $SnO_2$, ZnO, MgO, $Al_2O_3$, Si, GaN and CdS.

3. A nanotape as recited in claim 1, wherein the sintered oxide target is made from a material selected from the group consisting essentially of $TiO_2$, transition metal doped $TiO_2$, $BaTiO_3$, ZnO, transition metal doped ZnO, $LaMnO_3$, $BaTiO_3$, $PbTiO_3$, $YBa_2Cu_3O_z$, and $SrCu_2O_2$ and other p-type oxides.

4. A nanotape as recited in claim 1, wherein the oxide comprises $Co_{0.05}Ti_{0.95}O_2$.

5. A nanotape as recited in claim 1, wherein the oxide is selected from the group consisting of $Mn_{0.1}Zn_{0.9}O$ and $Ni_{0.1}Zn_{0.9}O$.

6. A nanotape as recited in claim 1, wherein said nanotape is formed by a process comprising:
   providing said nanoribbon substrate; and
   ablating a sintered oxide target such that it is deposited on the flat surface of the substrate.

7. A nanotape as recited in claim 6, wherein the oxide is deposited on the substrate using a pulsed laser ablation deposition process.

8. A nanotape as recited in claim 7, wherein the oxide is ablated using a pulsed Nd:YAG laser.

9. A nanotape as recited in claim 8, wherein the Nd:YAG laser pulses at approximately 3 Hz to approximately 10 Hz.

10. A nanotape as recited in claim 9, wherein the Nd:YAG laser emits approximately 20 mJ/pulse to approximately 50 mJ/pulse.

11. A nanotape as recited in claim 7, wherein the oxide is ablated in an oxygen atmosphere of approximately 100 mTorr to approximately 500 mTorr.

12. A nanotape as recited in claim 7, wherein the oxide is ablated at approximately 600° C.

13. A nanotape as recited in claim 7, wherein the oxide is ablated at approximately 700° C.

14. A nanotape as recited in claim 1, wherein said nanotape is formed by a process comprising:
   providing said nanoribbon substrate;
   placing the substrate in a quartz tube;
   placing the quartz tube within a horizontal tube furnace;
   providing a sintered oxide target near the quartz tube; and
   ablating the sintered oxide target such that it is deposited on the substrate.

15. A nanotape, comprising:
   a nanoribbon substrate, said substrate selected from the group of materials consisting of $SnO_2$, ZnO, MgO, $Al_2O_3$, Si, GaN and CdS; and
   a layer of material epitaxially deposited on a flat surface of the nanoribbon substrate to form a two-layer nanotape, said material selected from the group consisting of $TiO_2$, transition metal doped $TiO_2$, $BaTiO_3$, ZnO, transition metal doped ZnO, $LaMnO_3$, $BaTiO_3$, $PbTiO_3$, $YBa_2Cu_3O_z$, and $SrCu_2O_2$ and other p-type oxides.

16. A nanotape as recited in claim 15, wherein the nanotape has a generally rectangular cross-section.

17. A nanotape as recited in claim 15, wherein the layer of material comprises $Co_{0.05}Ti_{0.95}O_2$.

18. A nanotape as recited in claim 15, wherein the layer of material is selected from the group consisting of $Mn_{0.1}Zn_{0.9}O$ and $Ni_{0.1}Zn_{0.9}O$.

19. A nanotape as recited in claim 15, wherein said nanotape is formed by a process comprising:
   providing said nanoribbon substrate; and
   ablating a sintered oxide target such that it is deposited on the flat surface of the substrate.

20. A nanotape as recited in claim 19, wherein the oxide is deposited on the substrate using a pulsed laser ablation deposition process.

21. A nanotape as recited in claim 20, wherein the oxide is ablated using a pulsed Nd:YAG laser.

22. A nanotape as recited in claim 21, wherein the Nd:YAG laser pulses at approximately 3 Hz to approximately 10 Hz.

23. A nanotape as recited in claim 22, wherein the Nd:YAG laser emits approximately 20 mJ/pulse to approximately 50 mJ/pulse.

24. A nanotape as recited in claim 20, wherein the oxide is ablated in an oxygen atmosphere of approximately 100 mTorr to approximately 500 mTorr.

25. A nanotape as recited in claim 20, wherein the oxide is ablated at approximately 600° C.

26. A nanotape as recited in claim 20, wherein the oxide is ablated at approximately 700° C.

27. A nanotape as recited in claim 15, wherein said nanotape is formed by a process comprising:
   providing said nanoribbon substrate;
   placing the substrate in a quartz tube;
   placing the quartz tube within a horizontal tube furnace;
   providing a sintered oxide target near the quartz tube; and
   ablating the sintered oxide target such that it is deposited on the substrate.

28. A bilayer nanotape, comprising:
   a nanoribbon substrate; and
   a metal layer deposited on a flat surface of the nanoribbon substrate to form a two-layer nanotape having a generally rectangular cross-section.

29. A nanotape as recited in claim 28, wherein the nanoribbon comprises a material selected from the group consisting essentially of $SnO_2$, ZnO, MgO, $Al_2O_3$, Si, GaN and CdS.

30. A nanotape as recited in claim 28, wherein the metal layer is made from a material selected from the group consisting essentially of Cu, Au, Ti, Al, Pt, and Ni.

31. A nanotape as recited in claim 28, wherein the metal layer is deposited on the substrate using a thermal evaporation process.

32. A nanotape as recited in claim 28, wherein the nanotape bends as a function of temperature.

33. A bilayer nanotape, comprising:
   a nanoribbon substrate; and
   a metal layer deposited on a flat surface of the nanoribbon substrate to form a two-layer nanotape having a generally rectangular cross-section;
   wherein said nanostructure bends as a function of temperature.

34. A nanotape as recited in claim 33, wherein the nanoribbon comprises a material selected from the group consisting of $SnO_2$, ZnO, MgO, $Al_2O_3$, Si, GaN and Cds.

35. A nanotape as recited in claim 33, wherein the metal layer is made from a material selected from the group consisting of Cu, Au, Ti, Al, Pt, and Ni.

36. A nanotape as recited in claim 33, wherein the metal layer is deposited on the substrate using a thermal evaporation process.

37. A bilayer nanotape, comprising:
a nanoribbon substrate, said substrate comprising a material selected from the group consisting of $SnO_2$, ZnO, MgO, $Al_2O_3$, Si, GaN and CdS; and
a metal layer deposited on a flat surface of the nanoribbon substrate to form a two-layer nanotape having a generally rectangular cross-section, said metal layer comprising a material selected from the group consisting of Cu, Au, Ti, Al, Pt, and Ni;
wherein said nanostructure bends as a function of temperature.

38. A nanotape as recited in claim 37, wherein the metal layer is deposited on the substrate using a thermal evaporation process.

* * * * *

UNITED STATES PATENT AND TRADEMARK OFFICE
CERTIFICATE OF CORRECTION

| | | |
|---|---|---|
| PATENT NO. | : 7,303,815 B2 | Page 1 of 1 |
| APPLICATION NO. | : 10/642043 | |
| DATED | : December 4, 2007 | |
| INVENTOR(S) | : Peidong Yang et al. | |

It is certified that error appears in the above-identified patent and that said Letters Patent is hereby corrected as shown below:

Please replace the paragraph beginning at column 1, line 15 with the following:

--This invention was made with Government support of Grant No. DE-AC03-76SF00098, awarded by the Department of Energy (DOE). The government has certain rights in this invention.--

Signed and Sealed this

Seventeenth Day of February, 2009

JOHN DOLL
*Acting Director of the United States Patent and Trademark Office*